(12) United States Patent
Dede et al.

(10) Patent No.: US 10,901,161 B2
(45) Date of Patent: Jan. 26, 2021

(54) OPTICAL POWER TRANSFER DEVICES WITH AN EMBEDDED ACTIVE COOLING CHIP

(71) Applicants: Toyota Motor Engineering & Manufacturing North America, Inc., Plano, TX (US); University of Ottawa, Ottawa (CA); Broadcom Inc., San Jose, CA (US)

(72) Inventors: Ercan M. Dede, Ann Arbor, MI (US); Christopher Valdivia, Ottawa (CA); Matthew Wilkins, Ottawa (CA); Karin Hinzer, Ottawa (CA); Philippe-Olivier Provost, Salaberry-de-Valleyfield (CA); Denis Masson, Ottawa (CA); Simon Fafard, Ottawa (CA)

(73) Assignees: TOYOTA MOTOR ENGINEERING & MANUFACTURING NORTH AMERICA, INC., Plano, TX (US); UNIVERSITY OF OTTAWA, Ottawa (CA); BROADCOM INC., San Jose, CA (US)

( * ) Notice: Subject to any disclaimer, the term of this patent is extended or adjusted under 35 U.S.C. 154(b) by 0 days.

(21) Appl. No.: 16/131,842

(22) Filed: Sep. 14, 2018

(65) Prior Publication Data
US 2020/0091677 A1 Mar. 19, 2020

(51) Int. Cl.
*G02B 6/42* (2006.01)
*H01S 5/024* (2006.01)
(Continued)

(52) U.S. Cl.
CPC ......... *G02B 6/4269* (2013.01); *G02B 6/4214* (2013.01); *G02B 6/4257* (2013.01);
(Continued)

(58) Field of Classification Search
CPC . G02B 6/4257; G02B 6/4268; H01S 5/02415; H01S 5/0428; H01B 10/503; H01L 33/645
(Continued)

(56) References Cited

U.S. PATENT DOCUMENTS

| 4,454,602 A * | 6/1984 | Smith | H01S 5/4025 |
| | | | 257/712 |
| 4,716,568 A * | 12/1987 | Scifres | H01S 5/02236 |
| | | | 372/36 |

(Continued)

FOREIGN PATENT DOCUMENTS

JP 10190131 A * 7/1998 ......... H01S 5/02415

*Primary Examiner* — Daniel Petkovsek
(74) *Attorney, Agent, or Firm* — Dinsmore & Shohl LLP

(57) ABSTRACT

An optical power transfer device with an embedded active cooling chip is disclosed. The device includes a cooling chip made of a semiconductor material, and a first subassembly and a second subassembly mounted on the cooling chip. The cooling chip comprises at least one metallization layer on a portion of a first surface of the cooling chip, at least one inlet through a second surface of the cooling chip, wherein the second surface is opposite to the first surface, at least one outlet through the second surface and one or more micro-channels extending between and fluidly coupled to the at least one inlet and the at least one outlet. A cooling fluid flows through the one or more micro-channels. The first subassembly is mounted on the at least one metallization layer and comprises a laser. The second subassembly comprises a phototransducer configured to receive a laser beam from the laser.

12 Claims, 17 Drawing Sheets

(51) Int. Cl.
  *H01S 5/042*     (2006.01)
  *H04B 10/50*    (2013.01)
  *H01L 33/64*     (2010.01)
  *H04B 10/80*    (2013.01)

(52) U.S. Cl.
  CPC .......... *G02B 6/4268* (2013.01); *H01L 33/645* (2013.01); *H01S 5/02415* (2013.01); *H01S 5/0428* (2013.01); *H04B 10/503* (2013.01); *H04B 10/807* (2013.01)

(58) Field of Classification Search
  USPC .................................................... 372/34–36
  See application file for complete search history.

(56) References Cited

U.S. PATENT DOCUMENTS

| | | | |
|---|---|---|---|
| 5,287,001 A | 2/1994 | Buchmann et al. | |
| 5,640,407 A | 6/1997 | Freyman et al. | |
| 5,717,712 A | 2/1998 | Swaminathan et al. | |
| 5,872,881 A | 2/1999 | Rossi et al. | |
| 5,953,224 A | 9/1999 | Gold et al. | |
| 5,966,394 A | 10/1999 | Spurr et al. | |
| 6,027,256 A | 2/2000 | Nightingale et al. | |
| 6,072,814 A | 6/2000 | Ryan et al. | |
| 6,147,795 A | 11/2000 | Derbyshire et al. | |
| 6,219,245 B1 | 4/2001 | Nagashima | |
| 6,229,939 B1 | 5/2001 | Komine | |
| 6,252,726 B1 | 6/2001 | Verdiell | |
| 6,314,121 B1 * | 11/2001 | Usui | H01S 3/0941 372/36 |
| 6,496,524 B2 | 12/2002 | Miyokawa et al. | |
| 6,663,294 B2 | 12/2003 | Crane, Jr. et al. | |
| 6,771,437 B1 | 8/2004 | Willis | |
| 6,773,532 B2 | 8/2004 | Wolf et al. | |
| 6,807,345 B2 | 10/2004 | Simon | |
| 6,853,559 B2 | 2/2005 | Panella et al. | |
| 6,876,681 B2 | 4/2005 | Nagamatsu | |
| 6,958,907 B2 | 10/2005 | Sato et al. | |
| 6,992,895 B2 * | 1/2006 | Lindberg | G02B 6/4277 257/724 |
| 7,018,114 B2 | 3/2006 | Stewart | |
| 7,056,035 B2 | 6/2006 | Lida et al. | |
| 7,088,898 B2 | 8/2006 | Moulton et al. | |
| 7,099,552 B1 | 8/2006 | Oron et al. | |
| 7,118,292 B2 | 10/2006 | Miao et al. | |
| 7,215,547 B2 | 5/2007 | Chang et al. | |
| 7,230,334 B2 * | 6/2007 | Andry | H01L 23/473 257/713 |
| 7,334,630 B2 | 2/2008 | Goodson et al. | |
| 7,366,214 B2 | 4/2008 | Liu et al. | |
| 7,426,225 B2 | 9/2008 | Go et al. | |
| 7,433,376 B1 | 10/2008 | Mandl et al. | |
| 7,561,805 B2 | 7/2009 | Aoki et al. | |
| 7,656,915 B2 * | 2/2010 | Coleman | H01S 5/024 372/34 |
| 7,731,079 B2 * | 6/2010 | Campbell | H01L 23/473 228/245 |
| 7,962,044 B2 | 6/2011 | McCallion et al. | |
| 7,997,763 B2 | 8/2011 | Giardina et al. | |
| 8,189,278 B2 | 5/2012 | Roos et al. | |
| 8,248,320 B2 | 8/2012 | Mason et al. | |
| 8,413,712 B2 | 4/2013 | Brunschwiler et al. | |
| 8,587,863 B2 * | 11/2013 | Wakabayashi | G02F 1/353 359/328 |
| 8,737,441 B2 * | 5/2014 | Liu | H01L 23/473 372/34 |
| 8,852,378 B2 | 10/2014 | Huff et al. | |
| 8,905,632 B2 | 12/2014 | Shastri et al. | |
| 9,054,812 B2 | 6/2015 | Yagisawa et al. | |
| 9,084,885 B2 | 7/2015 | Deisseroth | |
| 9,113,576 B2 * | 8/2015 | Daly | H05K 7/20281 |
| 9,136,704 B2 | 9/2015 | Cummings | |
| 9,188,752 B2 | 11/2015 | Nong Chou et al. | |
| 9,190,808 B1 | 11/2015 | Lin et al. | |
| 9,217,838 B2 | 12/2015 | Hsieh | |
| 9,370,123 B2 | 6/2016 | Blumenthal | |
| 9,510,479 B2 | 11/2016 | Vos | |
| 9,606,311 B2 | 3/2017 | Pikulski et al. | |
| 10,388,810 B1 * | 8/2019 | Dede | H01L 31/024 |
| 2005/0100290 A1 * | 5/2005 | Huang | G02B 6/4201 385/92 |
| 2007/0278666 A1 | 12/2007 | Garcia et al. | |
| 2007/0297468 A1 | 12/2007 | Stewart et al. | |
| 2010/0195074 A1 | 8/2010 | Sogard | |
| 2015/0323751 A1 | 11/2015 | Zagoneanu | |
| 2016/0218048 A1 * | 7/2016 | Kazemi | H01L 23/3672 |
| 2017/0023751 A1 | 1/2017 | Steijer et al. | |
| 2017/0096066 A1 | 4/2017 | Lee et al. | |
| 2017/0263532 A1 * | 9/2017 | Fukuoka | H01L 23/467 |

* cited by examiner

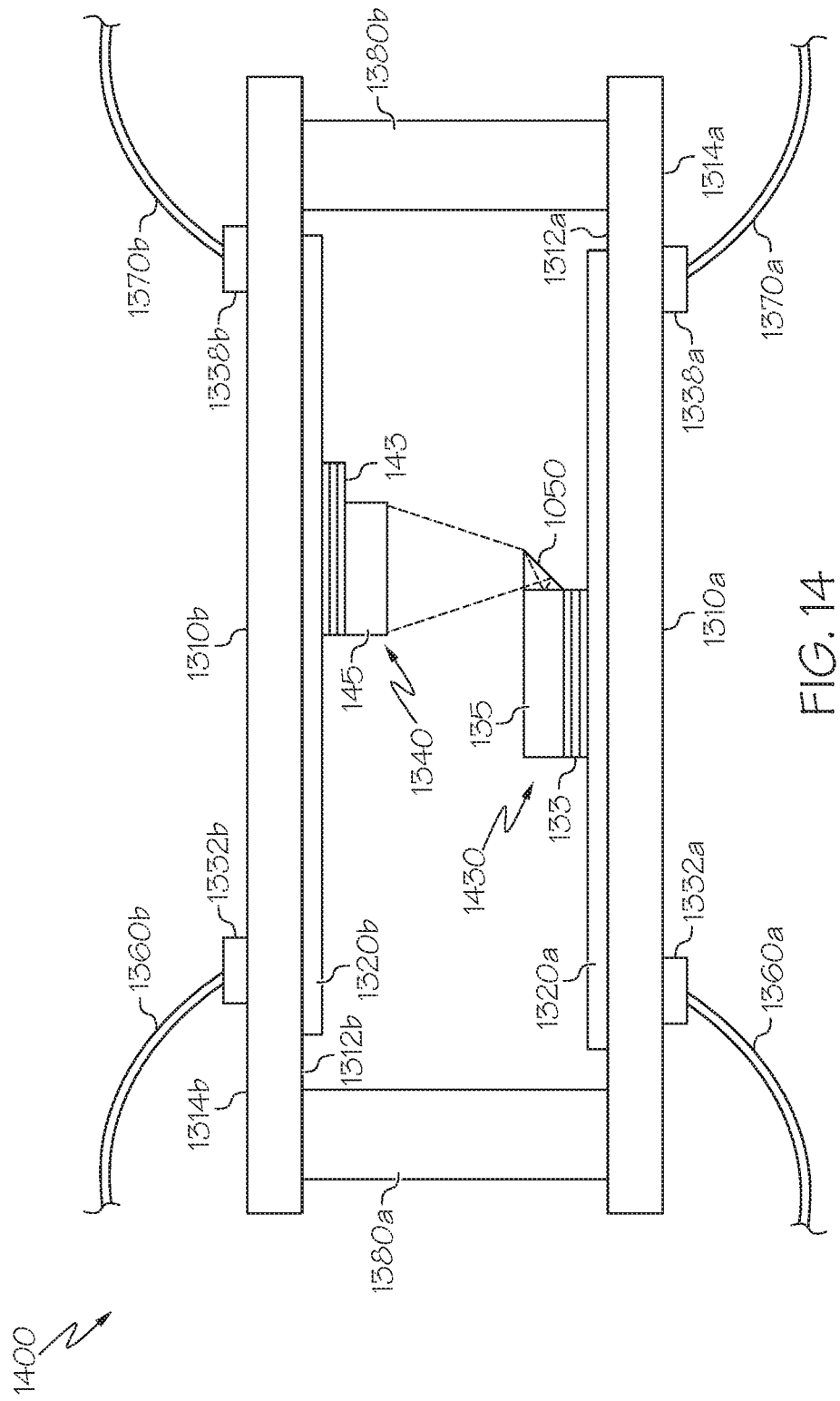

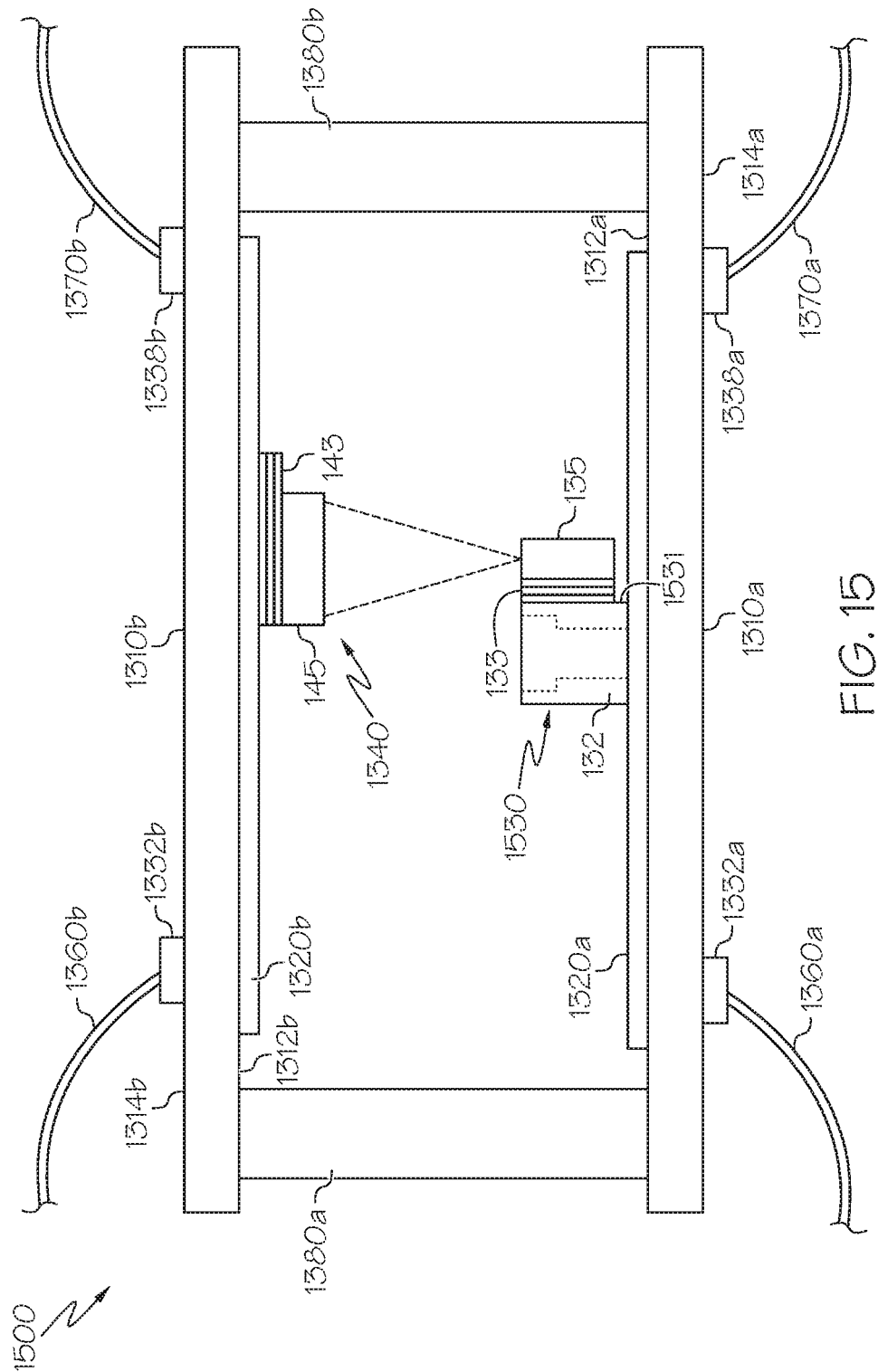

OPTICAL POWER TRANSFER DEVICES WITH AN EMBEDDED ACTIVE COOLING CHIP

TECHNICAL FIELD

Embodiments described herein generally relate to power electronic devices and more particularly, to optical power transfer devices with an embedded active cooling chip and methods of cooling an optical power transfer device using a cooling chip.

BACKGROUND

Worldwide environmental, economic, and political factors are pushing industries away from fossil fuels and towards electrification. In the automotive industry, this is encouraging the adoption of electric motors and other systems in electric personal vehicles, buses, trucks, and trains at an increasing pace. Ever increasing steps towards autonomous vehicles are pushing the integration of large numbers of sensors and smart devices into each vehicle. High power and high switching rates create an electrically noisy environment in which sensitive electronic and electrical components can malfunction if they are not properly isolated.

Optical devices consisting of a transmitter (e.g. laser, light emitting diode and the like) and a receiver (e.g. phototransducer, laser power converter, photonic power converter, optical converter, optical power receiver, solar cell, photovoltaic device (collectively "phototransducer" for simplicity)) are increasingly used as optical power transfer devices because they can achieve desirable optical isolation. These devices are capable of delivering optically-isolated electrical power to sensitive electronics or remote devices in noisy and harsh environments. Thus, these optical power transfer devices have high potential for application in isolated power supplies used in various industries such as the automotive industry. They are constructed from lightweight materials, can be integrated into small packages, provide optical isolation with no energy buffering, operate wirelessly, and permit integration of power with digital or analog signals on a single optical link.

A standard method of cooling optical devices is by utilizing solid-state technology such as thermoelectric coolers, where power lost in the form of heat from the optical device is transferred to the thermoelectric coolers. While this method of cooling is adequate when the optical device is used in communication applications, it may not be adequate when the optical device is used as a power transfer device, which operates at a higher power level. The power lost in the form of heat from an optical device is greater in power transfer applications than in communication application. This creates a need for higher performance cooling methods for optical power transfer devices.

SUMMARY

Various embodiments of an optical power transfer device with an embedded active cooling chip are described. In one embodiment, the optical power transfer device includes a cooling chip made of a semiconductor material, and a first subassembly and a second subassembly mounted on the cooling chip. The cooling chip includes at least one metallization layer on a portion of a first surface of the cooling chip, at least one inlet through a second surface of the cooling chip, wherein the second surface is opposite to the first surface, at least one outlet through the second surface and one or more micro-channels extending between and fluidly coupled to the at least one inlet and the at least one outlet. A cooling fluid flows through the one or more micro-channels. The first subassembly is mounted on the at least one metallization layer and includes a laser. The second subassembly includes a phototransducer configured to receive a laser beam from the laser.

In another embodiment, the optical power transfer device includes a first cooling chip and a second cooling chip positioned opposite to the first cooling chip, a first subassembly mounted on the first cooling chip and a second subassembly mounted on the second cooling chip. Each cooling chip is made of a semiconductor material and includes at least one metallization layer on a portion of a first surface of the cooling chip, at least one inlet through a second surface of the cooling chip, wherein the second surface is opposite to the first surface, at least one outlet through the second surface and one or more micro-channels extending between and fluidly coupled to the at least one inlet and the at least one outlet. A cooling fluid flows through the one or more micro-channels. The first subassembly is mounted on the at least one metallization layer of the first cooling chip and includes a laser. The second subassembly is mounted on the at least one metallization layer of the second cooling chip and includes a phototransducer configured to receive a laser beam from the laser.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which:

FIG. 14 schematically depicts a side view of an example optical power transfer device having two cooling chips positioned opposite to each other, where the laser mounted on the first cooling chip is configured to vertically illuminate the phototransducer mounted on the second cooling chip by refracting the laser beam through an optical element coupled to the laser, according to one or more embodiments described and illustrated herein; and FIG. 15 schematically depicts a side view of an example optical power transfer device having two cooling chips positioned opposite to each other, where the laser is mounted to the side of a C-mount such that the laser beam is directly incident on the phototransducer to vertically illuminate the phototransducer, according to one or more embodiments described and illustrated herein.

DETAILED DESCRIPTION

Embodiments disclosed herein relate to optical power transfer devices with an embedded active cooling chip. The optical power transfer devices described herein include a laser subassembly functioning as a laser and a phototransducer subassembly functioning as a receiver. However, other transmitters (e.g. light emitting diode) and receivers (e.g. laser power converter, photonic power converter, optical converter, optical power receiver, solar cell, photovoltaic device) may be used in alternate embodiments. In embodiments described herein, both the laser subassembly and the phototransducer subassembly of the optical power transfer device are constructed using a semiconductor cooling chip as a substrate. Both the laser subassembly and the phototransducer subassembly may include one or more spacer blocks and/or substrates, made from materials that are electrically insulating yet thermally conductive. This design enables the heat generated during the operation of the device to reach the cooling chip, while still maintaining electrical insulation of the subassemblies. The cooling chip has a fluid inlet, a fluid outlet and a number of micro-channels fluidly connected to the fluid inlet and the fluid outlet. A cooling fluid is circulated through the micro-channels in the cooling chip to continuously remove the heat generated, thereby keeping the device at an optimal temperature for a highly efficient and reliable performance. Various embodiments of the optical power transfer device are described in more detail below.

Figure 1:
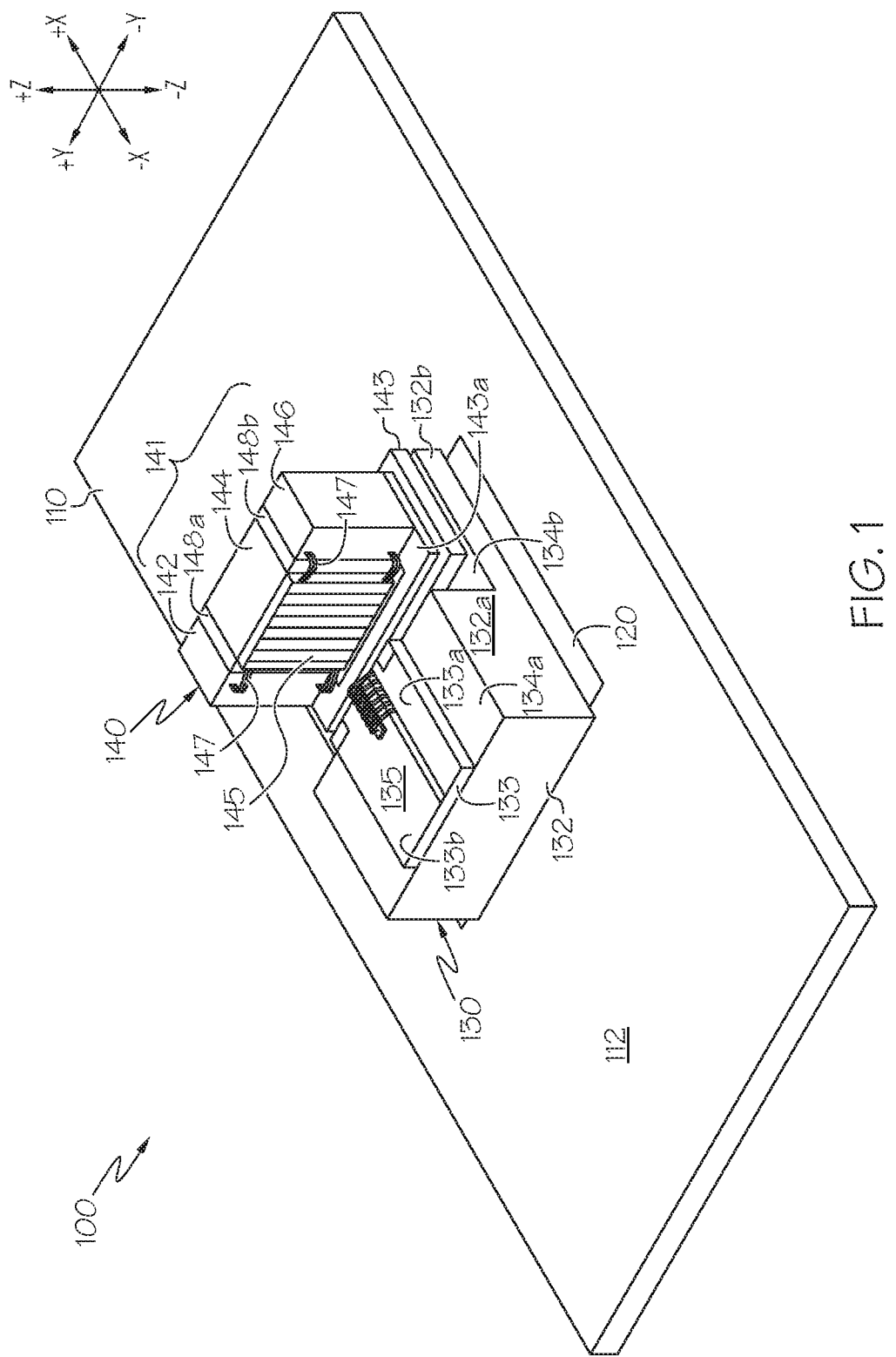
FIG. 1 depicts an example optical power transfer device where the first and second subassemblies are constructed on the same mount, according to one or more embodiments described and illustrated herein.

Referring now to FIG. 1, an example optical power transfer device 100 (hereinafter "device 100") is disclosed. The device 100 has a cooling chip 110 made of a semiconductor material such as, but not limited to, silicon. The cooling chip 110 may be fabricated using silicon microelectromechanical system (MEMS) etching technology to create a cooling structure topology (or fluid flow path) within the device 100 itself. The cooling chip 110 has a top surface 112 and a bottom surface 114. The cooling chip 110 has a metallization layer 120 disposed on a portion of the top surface 112. A fluid inlet 332 and a fluid outlet 338 are connected through the bottom surface 114 of the cooling chip 110 (shown in FIGS. 4-12). One or more micro-channels 324 (shown in FIGS. 3C-3D) extend between the fluid inlet 332 and the fluid outlet 338 and have a cooling fluid flowing through them. In some embodiments, the cooling fluid is a dielectric coolant such as, but not limited to, HFE-7100 (methoxy-nonafluorobutane).

Figure 2:
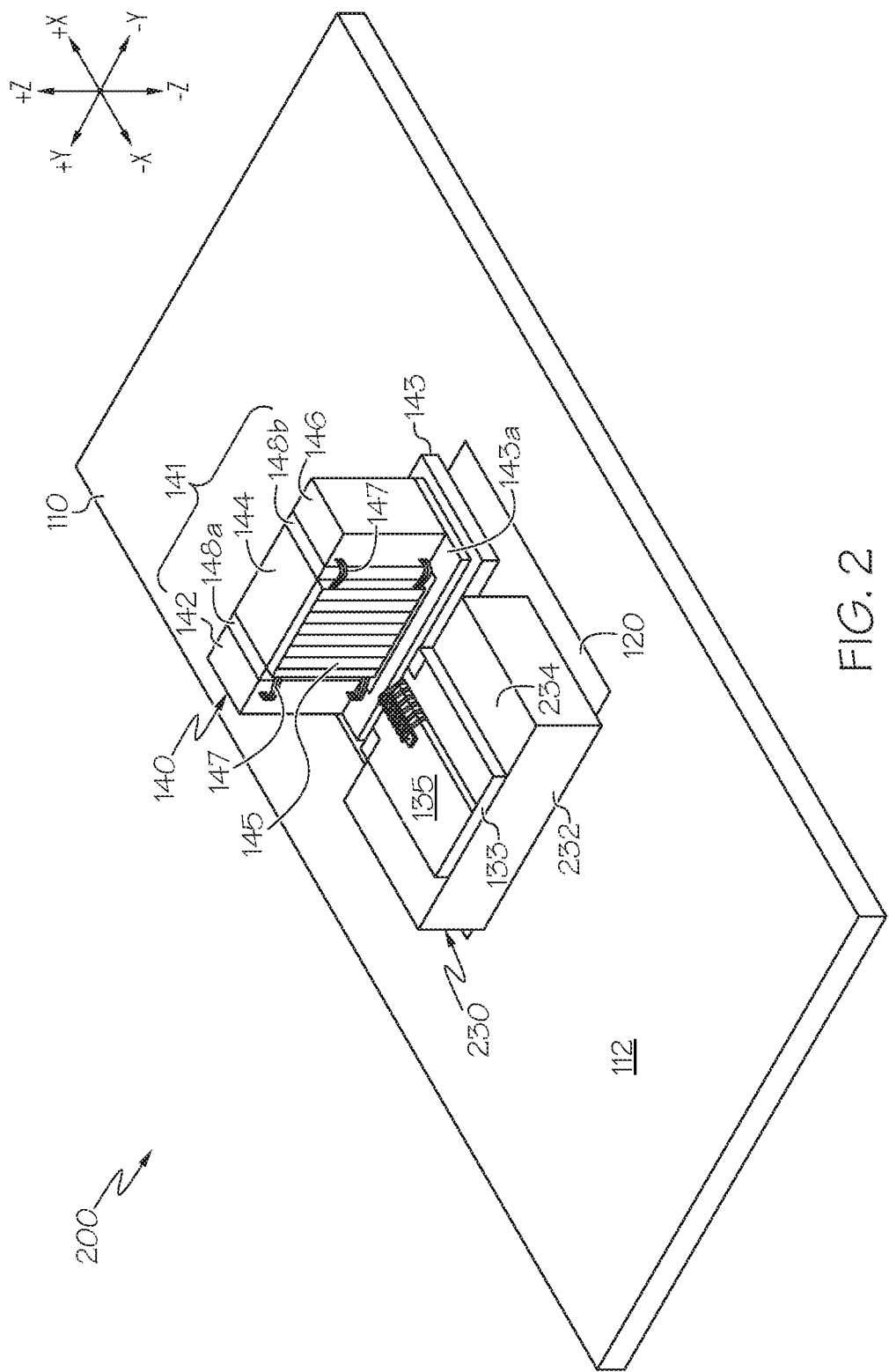
FIG. 2 depicts an example optical power transfer device where the first subassembly and second subassembly are constructed on different mounts, according to one or more embodiments described and illustrated herein.

A first subassembly 130 is mounted on the cooling chip 110 and includes an edge-emitting laser 135 configured to transmit a laser beam. The first subassembly 130 is mounted on the metallization layer 120 and has a first mount 132. The first mount 132 is coupled to the metallization layer 120 and made of an electrically conductive material such as, but not limited to, copper. The example first mount 132 as shown in FIG. 1 has a first portion 132a and a second portion 132b. The first portion 132a has a greater thickness than the second portion 132b and is configured to mount the laser 135 on a top surface 134a thereof. The second portion 132b has a lesser thickness than the first portion 132a and is configured to mount a second subassembly 140 on a top surface 134b thereof. The thickness of the first portion 132a and the second portion 132b could be adjusted to align the laser 135 with the second assembly 140. In some embodiments, as shown in FIG. 1, the first subassembly 130 may include a substrate 133 bonded to the laser 135 and positioned between the first mount 132 and the laser 135. The substrate 133 has a first contact pad 133a and a second contact pad 133b such that a current flows through the laser 135 from the first contact pad 133a to the second contact pad 133b. The substrate 133 is configured to electrically isolate the laser 135 from the first mount 132. As a non-limiting example, the substrate 133 may be a direct bonded copper (DBC) substrate. The DBC substrate has suitably high thermal conductivity for conducting heat generated from the laser 135 to the first mount 132. In some embodiments as shown in FIG. 1, the first mount 132 supports the second subassembly 140; in other embodiments, it does not. For example, FIG. 2 depicts an example optical power transfer device 200 where the first subassembly 230 is constructed on a first mount 232, which does not support the second subassembly 140.

Figure 10:
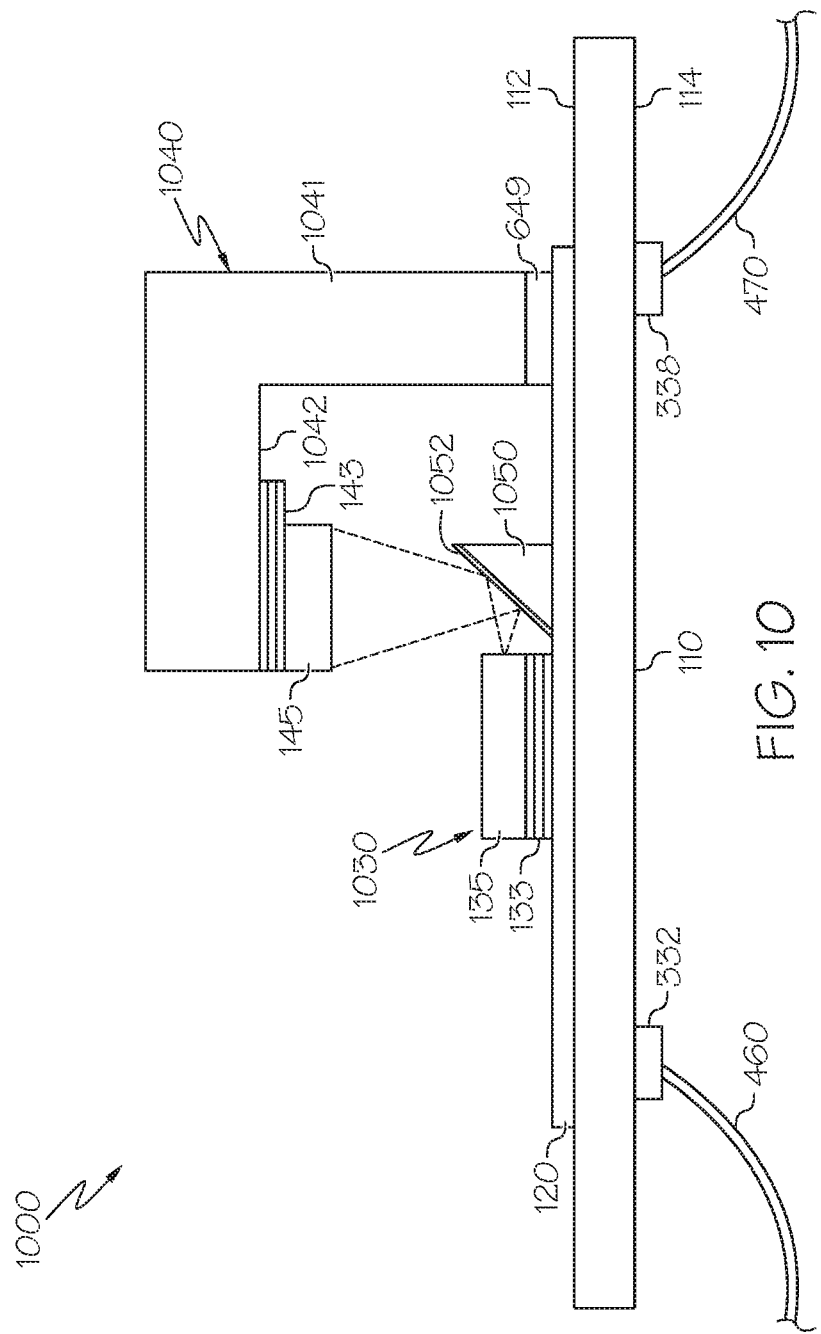
FIG. 10 schematically depicts a side view of an example optical power transfer device where the laser is configured to vertically illuminate the phototransducer by reflecting the laser beam on an optical element, according to one or more embodiments described and illustrated herein.

The second subassembly 140 includes a phototransducer 145 configured to receive a laser beam from the laser 135. In some embodiments, such as shown in FIG. 1, the phototransducer 145 is aligned perpendicular to a horizontal laser beam (in the +X direction) generated by the laser 135 and thus horizontally illuminated. In other embodiments, where the phototransducer 145 is positioned above the laser 135, such as shown in FIG. 10 and described in detail below, the laser beam from the laser 135 is redirected upwards (in the +Z direction) by an optical element 1050 towards the phototransducer 145 or the laser 135 is otherwise configured to vertically illuminate the phototransducer 145. The phototransducer 145 has a vertically-stacked multi junction design and is made of a semiconductor compound such as, but not limited to, Indium Gallium Arsenide ($In_xGa_{1-x}As$), where x is between 0 and 1. The efficiency, reliability and ease of use of this phototransducer design makes it ideally suited for the optical power transfer device 100 described herein.

In the example device 100 shown in FIG. 1, the second subassembly 140 includes a second mount 141 configured to mount the phototransducer 145 thereon. The example second mount 141 shown in FIG. 1 includes a first conductive block 142, a second conductive block 144 configured to mount the phototransducer 145, a third conductive block 146, a first insulating block 148a between the first conductive block 142 and the second conductive block 144, and a second insulating block 148b between the second conductive block 144 and the third conductive block 146. The first conductive block 142, the second conductive block 144 and the third conductive block 146 are made of an electrically conductive material such as, but not limited to, copper. The first insulating block 148a and the second insulating block 148b are made of an electrically conductive material such as, but not limited to, glass-reinforced epoxy laminate material. A number of electrically conductive wire bonds 147 are used to electrically connect the first conductive block 142 and the third conductive block 146 to the phototransducer 145.

Figure 1A:
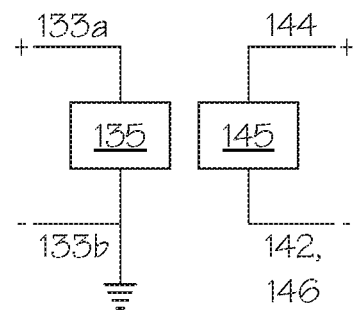
FIG. 1A depicts a schematic diagram of an exemplary electric circuit of the second subassembly of the optical power transfer device of FIG. 1, according to one or more embodiments described and illustrated herein.

FIG. 1A depicts a schematic diagram of an exemplary electric circuit of the second subassembly 140 of the optical power transfer device 100 of FIG. 1. An electric current flowing through the laser 135 from the first contact pad 133a to the second contact pad 133b generates a laser beam. An electric current is then generated in the phototransducer 145 in response to the laser beam from the laser 135. The electric current in the phototransducer 145 flows laterally (in the +/−Y direction) from the first conductive block 142 and/or the third conductive block 146 towards the grounded second conductive block 144 through the wirebonds 147. In some embodiments, the second conductive block 144 is electrically grounded, though in other embodiments, the grounding could be positioned elsewhere in the circuit such as, but not limited to, the contact pad 133b connected to the laser 135, as shown in FIG. 1A.

Figure 4:
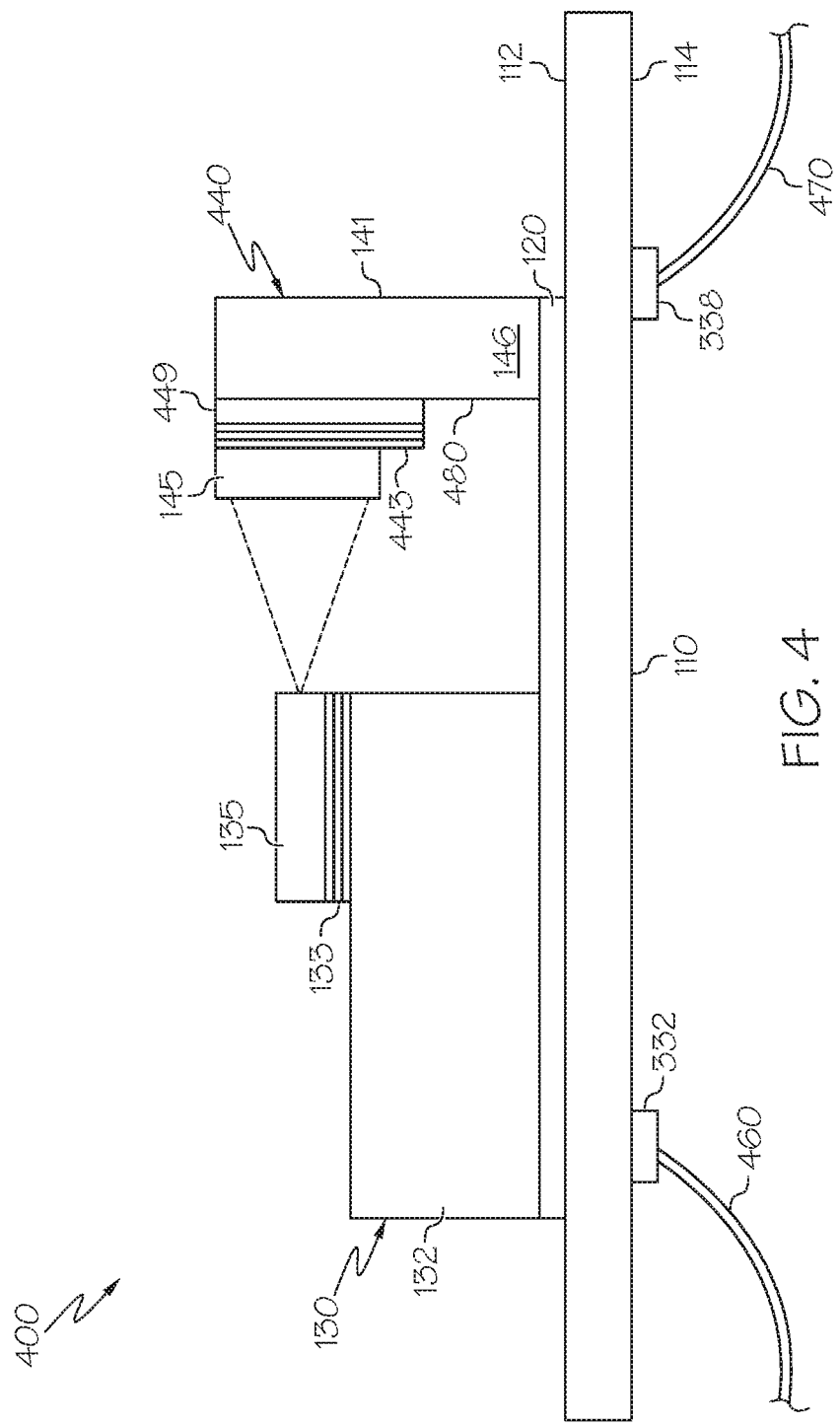
FIG. 4 schematically depicts a side view of an example optical power transfer device where the laser is configured to horizontally illuminate the phototransducer, according to one or more embodiments described and illustrated herein.
Figure 5:
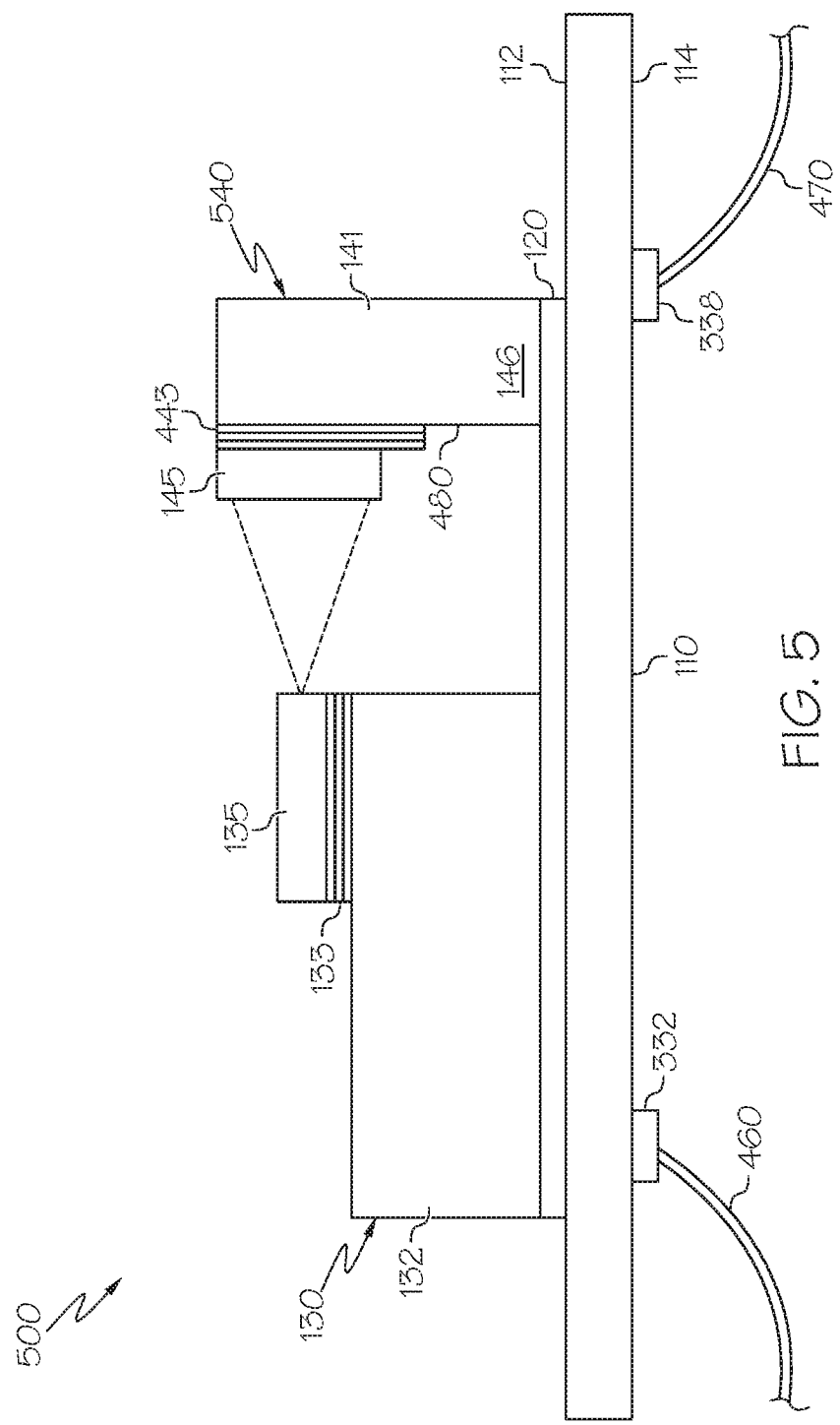
FIG. 5 schematically depicts a side view of an example optical power transfer device without a spacer block coupled to the phototransducer, where the laser is configured to horizontally illuminate the phototransducer, according to one or more embodiments described and illustrated herein.
Figure 6:
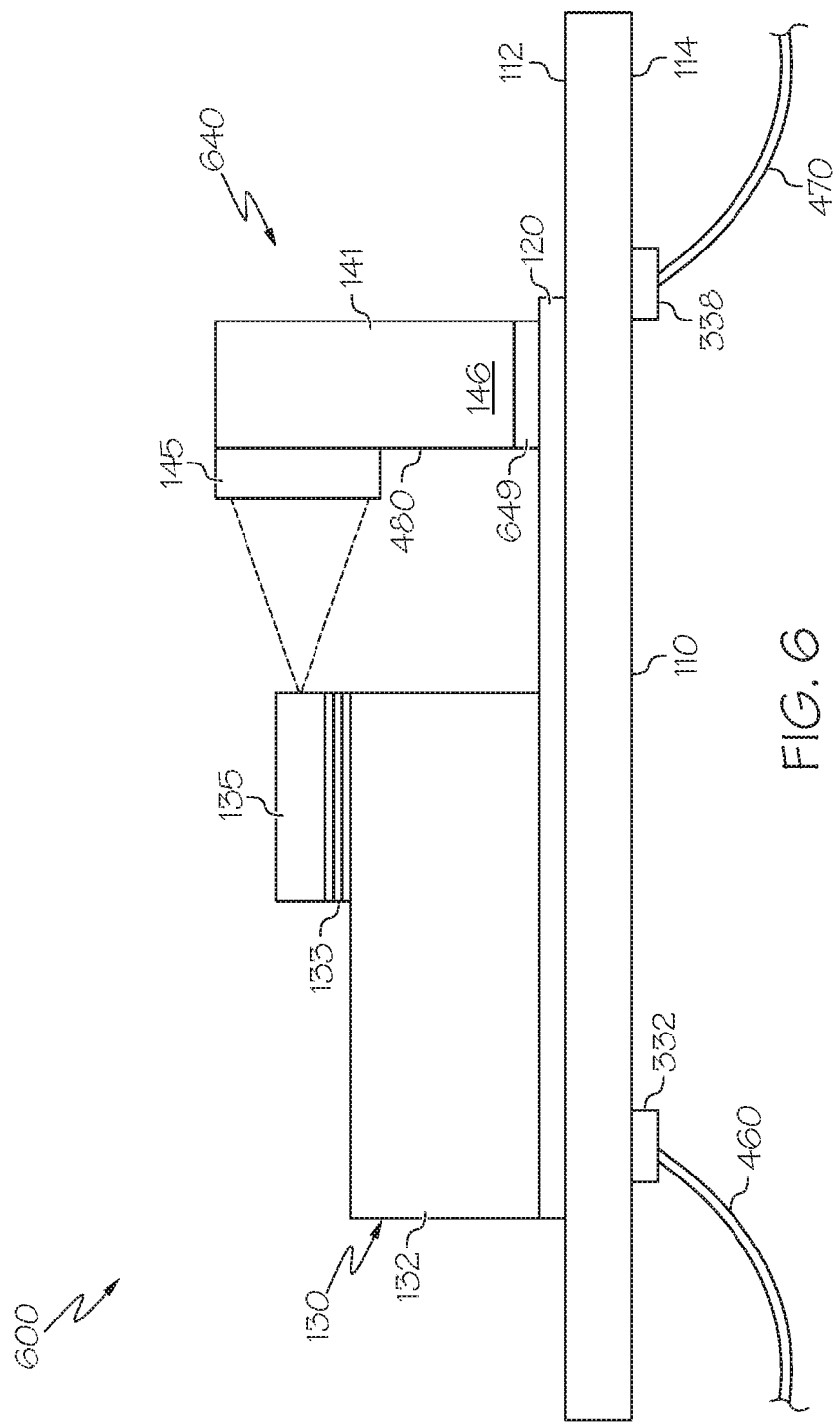
FIG. 6 schematically depicts a side view of an example optical power transfer device without a DBC substrate bonded to the phototransducer but having a spacer block coupled between the second mount and the metallization layer, where the laser is configured to horizontally illuminate the phototransducer, according to one or more embodiments described and illustrated herein.

In some embodiments such as in FIG. 1, the second subassembly 140 may include a substrate 143 upon which the second mount 141 is mounted; in other embodiments such as in FIGS. 4-5, the substrate 143 is bonded directly to the phototransducer 145. As a non-limiting example, the substrate 133 may be a DBC substrate having suitably high thermal conductivity. In some embodiments such as shown in FIG. 4, the second subassembly 440 may include a spacer block 449 coupled to the second mount 141 and positioned between the second mount 141 and the substrate 443 to which the phototransducer 145 is mounted. In other embodiments, such as shown in FIG. 6, a spacer block 649 is coupled to the second mount 141 and positioned between the second mount 141 and the metallization layer 120. The spacer block 449/649 may be made of an electrically insulating and thermally conductive material such as, but not limited to, aluminum oxide, aluminum nitride. The spacer block 449/649 may be conveniently sized to create further separation for enhanced electrical isolation beyond that realized by the DBC substrate.

Figure 8:
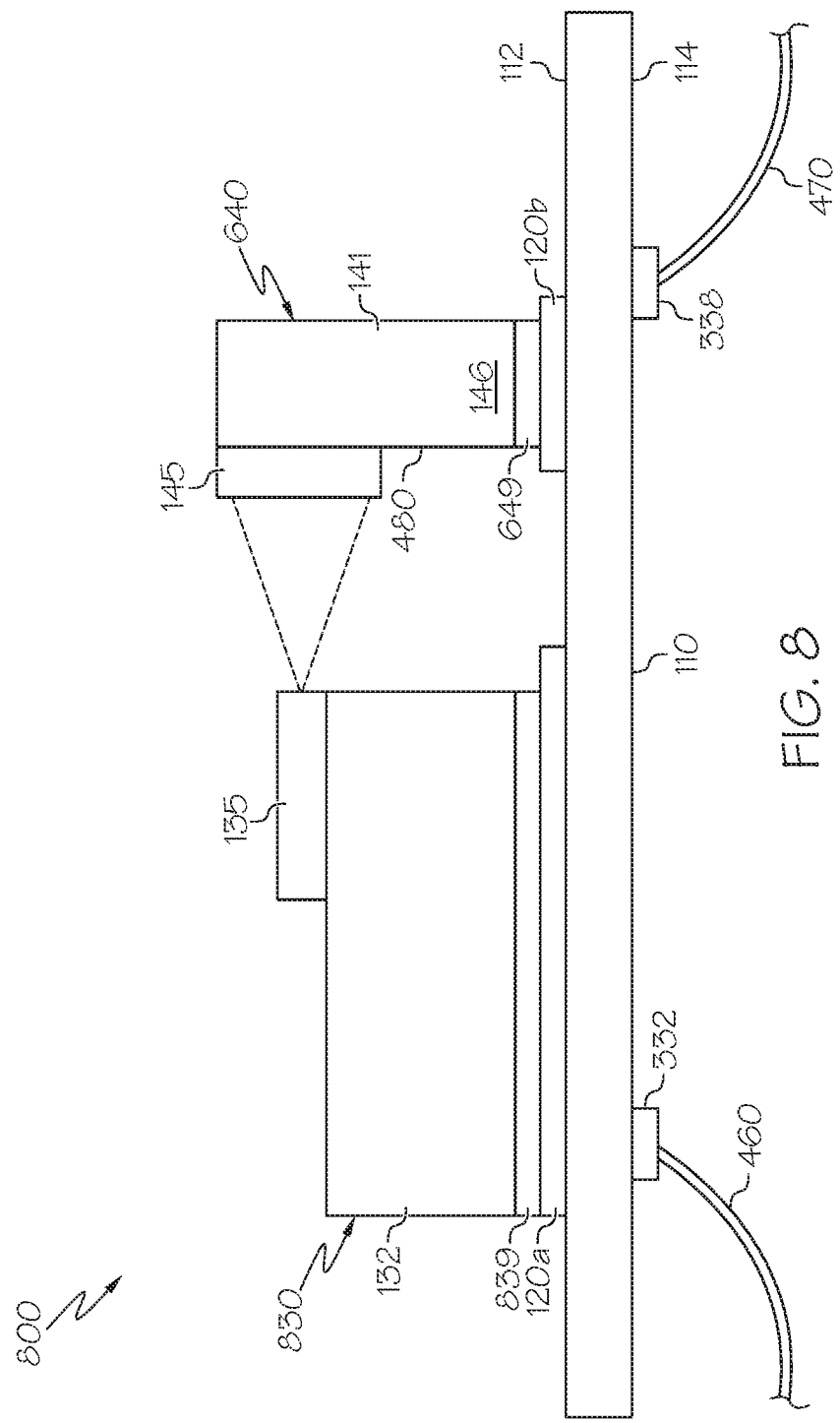
FIG. 8 schematically depicts a side view of an example optical power transfer device where the first subassembly containing the laser and the second subassembly containing the phototransducer are mounted on separate metallization layers, the laser and phototransducer are not bonded to DBC substrates and the laser is configured to horizontally illuminate the phototransducer, according to one or more embodiments described and illustrated herein.
Figure 9:
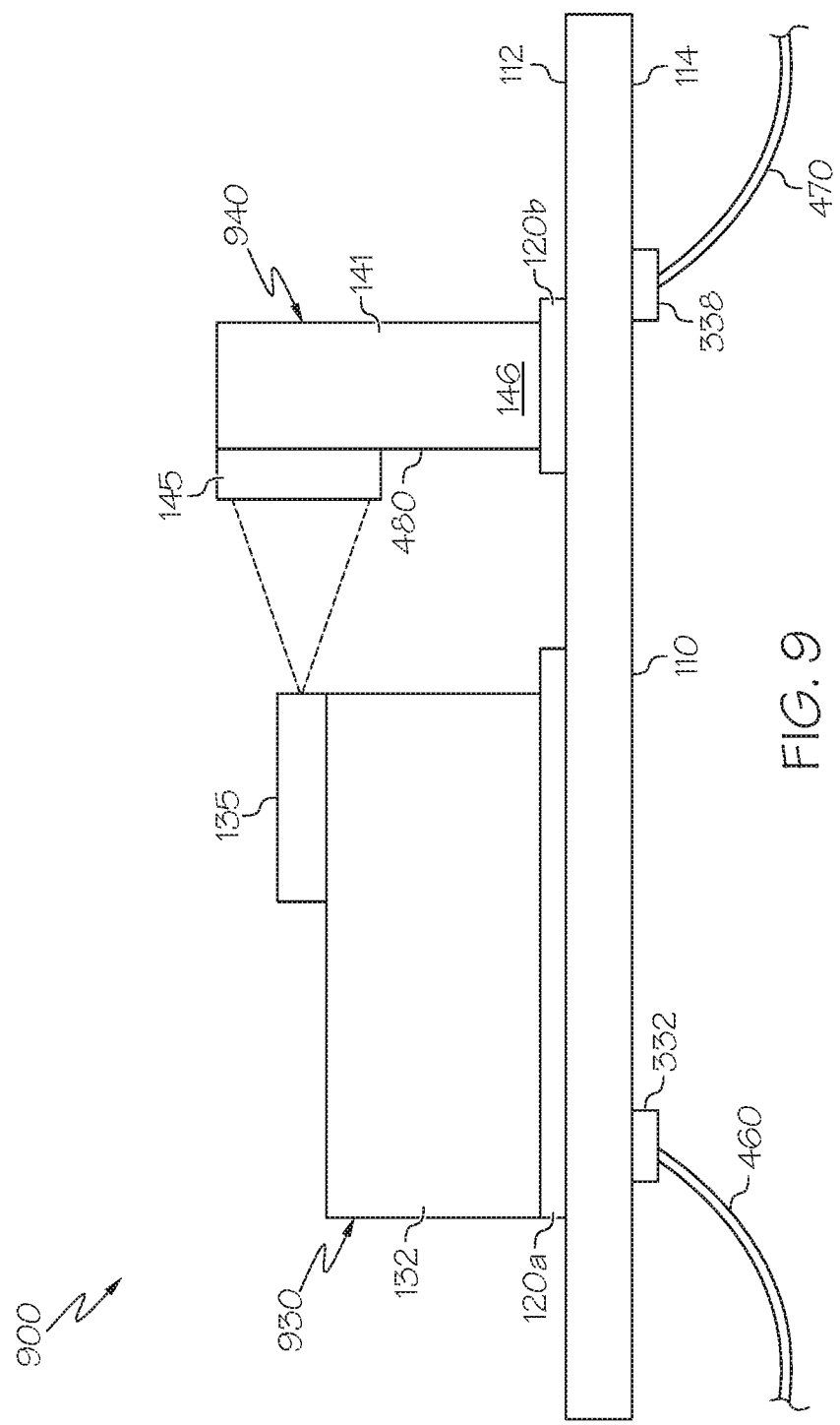
FIG. 9 schematically depicts a side view of an example optical power transfer device where the cooling chip is made from an electrically insulating material and the laser is configured to horizontally illuminate the phototransducer, according to one or more embodiments described and illustrated herein.

Mounting at the various interfaces shown in FIG. 1 may be achieved using conventional soldering techniques, silver sintering, silver-filled epoxy, or high-temperature die-attaching techniques such as transient liquid phase (TLP) bonding. The substrates 133, 143 can be optionally omitted from the packaging design as shown in FIGS. 8-9 discussed below. In those embodiments, the laser 135 and phototransducer 145 may be mounted directly on the cooling chip 110. The metallization layer 120 on the top surface 112 of cooling chip 110 is patterned to provide individual mounting pads (not shown) for the laser 135 and the phototransducer 145; electrical isolation is achieved via the electrical properties of the cooling chip 110 and the individual mounting pads on the metallization layer 120.

Figure 1B:
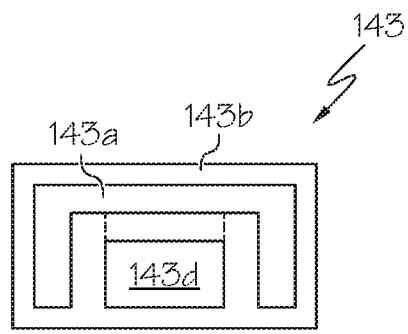
FIG. 1B depicts a top view of a direct bonded copper (DBC) substrate used in the second subassembly of the optical power transfer device of FIG. 1, according to one or more embodiments described and illustrated herein.

FIG. 1B depicts a top view of the substrate 143 used in the second subassembly 140 of the optical power transfer device 100 of FIG. 1. As mentioned above, the substrate 143 may be a DBC substrate having suitably high thermal conductivity. The substrate 143 is coupled to the second mount 141 and positioned between the second mount 141 and the metallization layer 120. The substrate 143 has a bottom layer 143c (not visible in FIG. 1A) made of metal such as, but not limited to, copper; a middle layer 143b made of a ceramic material such as, but not limited to, aluminum oxide, aluminum nitride, and the like; and a rectangular C-shaped top layer 143a with an island 143d, where both the top layer 143a and the island 143d are made of a conductive metal such as, but not limited to, copper. The top layer 143a and the island 143d may be patterned using a chemical etching process to form an electrical circuit, while the bottom layer 143c may be planar. The first conductive block 142 and the third conductive block 146 are mounted on the top layer 143a, while the second conductive block 144 is mounted on the island 143d. The first insulating block 148a and the second insulating block 148b are bonded to the first conductive block 142 and the third conductive block 146 respectively and rest on portions of the ceramic layer 143b between the island 143d and the top layer 143a.

Figure 3A:
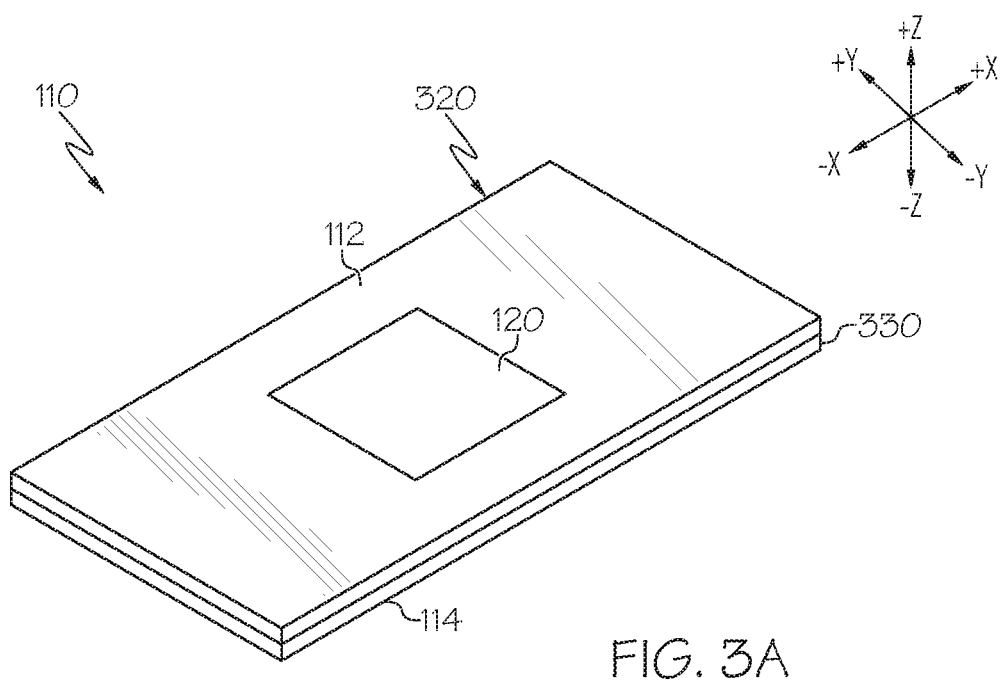
FIG. 3A schematically illustrates an isolated perspective view of an example cooling chip, according to one or more embodiments described and illustrated herein.
Figure 3B:
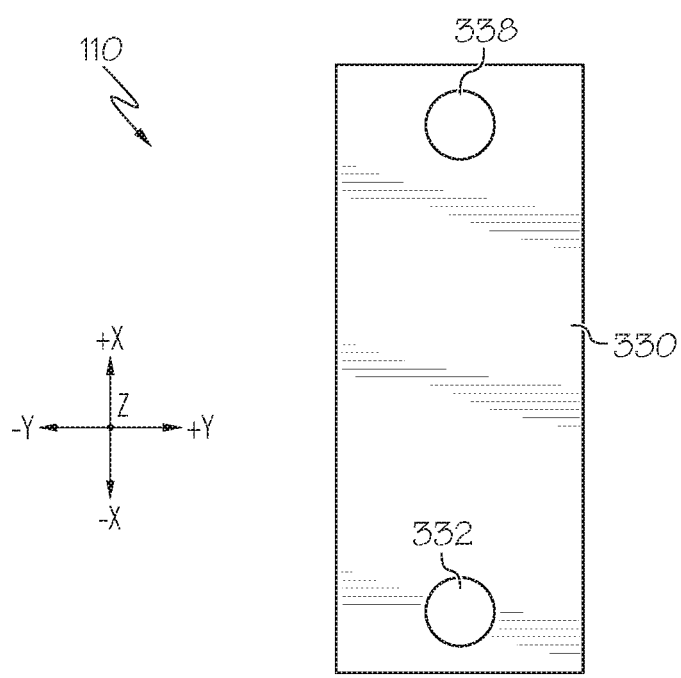
FIG. 3B schematically illustrates an isolated bottom view of the example cooling chip of FIG. 3A, according to one or more embodiments described and illustrated herein.
Figure 3C:
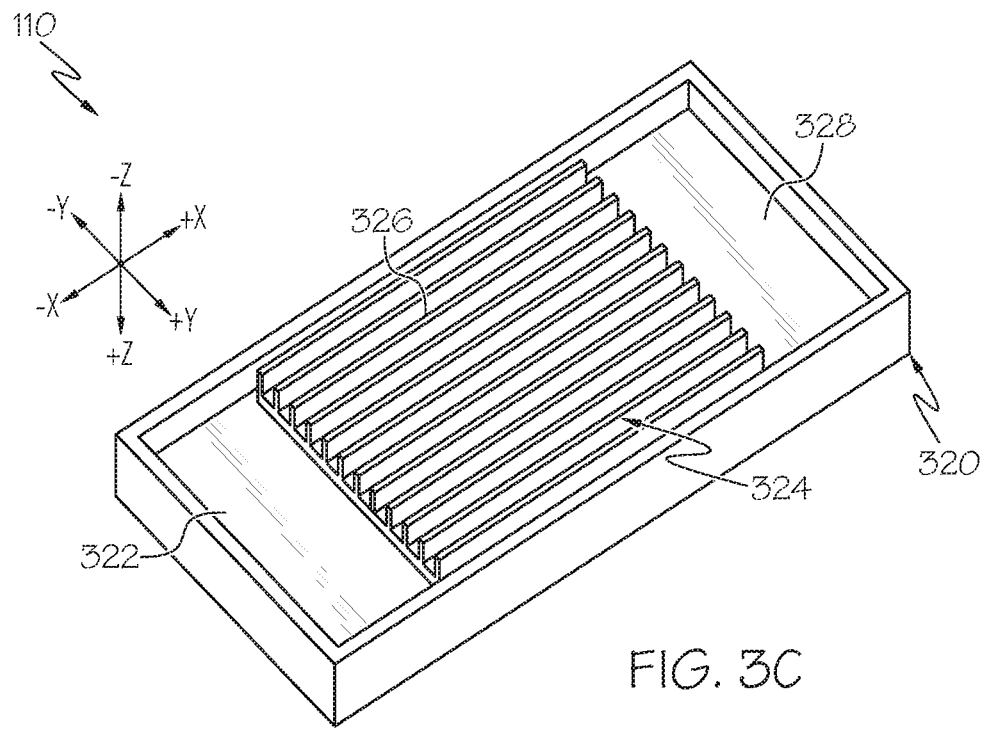
FIG. 3C schematically illustrates an isolated perspective view of an upper layer of the example cooling chip of FIG. 3A, according to one or more embodiments described and illustrated herein.
Figure 3D:
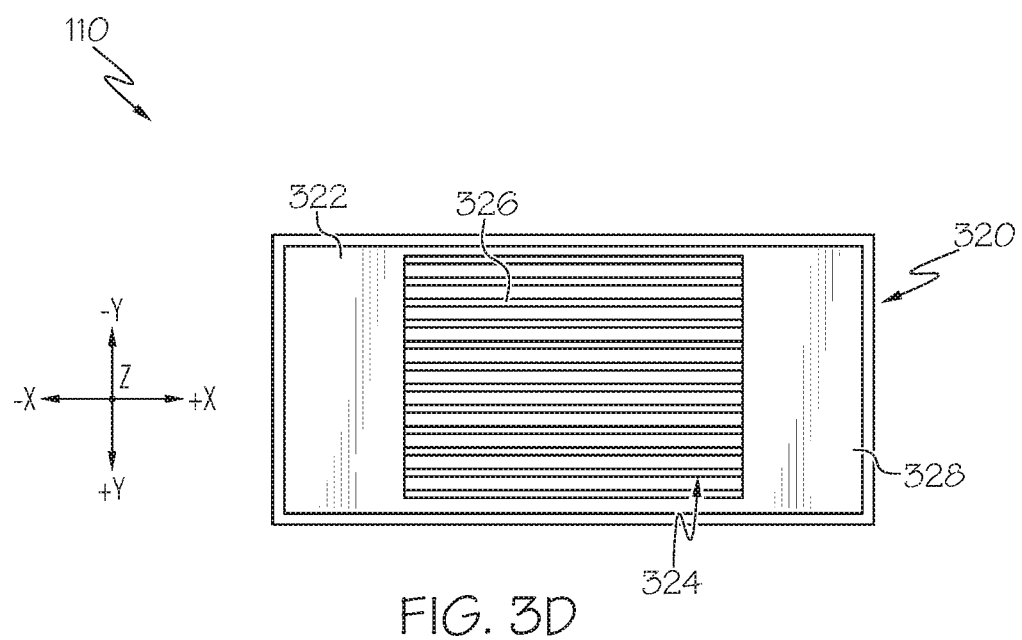
FIG. 3D schematically illustrates an isolated top view of the upper layer of the example cooling chip of FIG. 3A, according to one or more embodiments described and illustrated herein.

FIG. 3A is an isolated perspective view of the cooling chip 110 of the device 100 of FIG. 1, and FIG. 3B is an isolated bottom view of the cooling chip 110 of the FIG. 3A. FIG. 3C is an isolated perspective view of an upper layer 320 of the cooling chip 110 and FIG. 3D is an isolated top view of the upper layer 320 of the cooling chip 110. While only the cooling chip 110 is described with regards to FIGS. 3A-3D, it should be appreciated that other cooling chips described herein may have similar structure. The cooling chip 110 includes the upper layer 320 and a lower layer 330. The upper layer 320 is positioned above the lower layer 330 in the system vertical direction (i.e., along the +/−Z-axis of the coordinate axes of FIG. 1). Further, the upper layer 320 includes the top surface 112 of the cooling chip 110 upon which a metallization layer 120 is provided. The lower layer 330 includes the bottom surface 114 of the cooling chip 110. The lower layer 330 includes a fluid inlet 332 and a fluid outlet 338, which are configured as openings. The fluid inlet 332 is longitudinally (i.e., along the +/−X-axis of the coordinate axes of FIG. 1) spaced apart from the fluid outlet 338. The upper layer 320 is bonded to the lower layer 330 by any suitable process to form one or more micro-channels 324 therein.

The upper layer 320 provides the plurality of micro-channels 324 and the lower layer 330 provides the fluid inlet 332 and the fluid outlet 338 as described in greater detail below. The upper layer 320 includes an inlet pocket 322 and an outlet pocket 328. The inlet pocket 322 is longitudinally (i.e., along the +/−X-axis of the coordinate axes of FIG. 1) spaced apart from the outlet pocket 328. Disposed between the inlet pocket 322 and the outlet pocket 328 is the plurality of micro-channels 324. The plurality of micro-channels 324 may extend longitudinally (i.e., along the +/−X-axis of the coordinate axes of FIG. 1) from the inlet pocket 322 to the outlet pocket 328. In the embodiment of the plurality of micro-channels 324, as depicted in FIGS. 3C and 3D, the plurality of micro-channels 324 are between the top surface 112 of the upper layer 320 and the bottom surface 114 of the lower layer 330. The plurality of micro-channels 324 may be defined by an array of fins 326 such as, but not limited to, pin fins, channel fins, or the like, that collectively define at least a portion the fluid flow path. The array of fins 326 increase the surface area of the cooling chip 110 such that the cooling fluid flowing therethrough may contact an increased surface area of the cooling chip 110. The plurality of micro-channels 324 may have a straight design, or curvilinear design. Moreover, in some embodiments, the upper layer 320, the lower layer 330, the inlet pocket 322, the outlet pocket 328 and the plurality of micro-channels 324 may be etched in a semiconductor material such as, but not limited to, silicon, aluminum silicon carbide (AlSiC), aluminum nitride (AlN), and silicon carbide (SiC). Further, the array of fins 326 may be disposed at the fluid inlet 332 and the fluid outlet 338, such that the plurality of micro-channels 324 of the cooling chip 110 is in fluid communication with the fluid inlet 332 and the fluid outlet 338. Non-limiting example cooling chips are described in U.S. patent application Ser. No. 15/218,801 titled "Power Electronics Assemblies having a Semiconductor Device with Metallized Embedded Cooling Channels," filed Jul. 25, 2016, U.S. Pat. No. 10,032,694 titled "Power Electronics Assemblies Having a Semiconductor Cooling Chip and an Integrated Fluid Channel System," filed Jun. 7, 2016, and U.S. Pat. No. 10,020,243 titled "Power Electronics Assemblies having a Wide Bandgap Semiconductor Device and an Integrated Fluid Channel System," filed Jun. 7, 2016, which are hereby incorporated by reference.

FIGS. 4-15 schematically depict side views of various embodiments of optical power transfer devices having an embedded active cooling chip 110. The spread of the laser beam from the laser 135 to the phototransducer 145 is shown as dashed lines in FIGS. 4-15. FIG. 4 schematically depicts a side view of an example optical power transfer device 400 with the cooling chip 110, where the phototransducer 145 is positioned laterally with respect to the laser 135 such that the laser 135 can horizontally illuminate the phototransducer 145. The cooling chip 110 has a fluid inlet 332 and a fluid outlet 338 through the bottom surface 114. The fluid inlet 332 is fluidly coupled to a fluid injection conduit 460. The fluid outlet 338 is fluidly coupled to a fluid extraction conduit 470. The first subassembly 130 and the second subassembly 140 are both mounted on the metallization layer 120 of the cooling chip 110. The first subassembly 130 has the first mount 132 coupled to the metallization layer 120 and a substrate 133 mounted thereon. The laser 135 is bonded to the substrate 133. The second subassembly 140 has the second mount 141 coupled to the metallization layer 120. The second mount 141 may be configured as shown in FIG. 1 and described above. The spacer block 449 is coupled to a surface 480 of the second mount 141 facing the laser 135 and is thus positioned between the second mount 141 and the phototransducer 145. The phototransducer 145 is bonded to the substrate 143, which is coupled to the spacer block 449. In some embodiments, the substrates 133 and 143 may be a DBC substrate having suitably high thermal conductivity; in other embodiments, the substrate 133 may be replaced with any other substrate configured to electrically isolate the laser 135 from the first mount 132 and the substrate 143 may be replaced with any other substrate configured to electrically isolate the phototransducer 145 from the second mount 141. The laser 135 is adjustably aligned within the first subassembly 130 so that the phototransducer 145 receives maximum exposure to the laser beam generated by the laser 135. The electric current generated in the phototransducer 145 in response to the laser beam from the laser 135 flows laterally (in the +/−Y direction) from the first conductive block 142 and/or the third conductive block 146 towards the grounded second conductive block 144 through the wirebonds 147. FIG. 5 shows a similar optical power transfer device 500 similar to the optical power transfer device 400 of FIG. 4 except the second subassembly 140 does not include the spacer block 449 coupled to the side 480 of the second mount 141.

Figure 7:
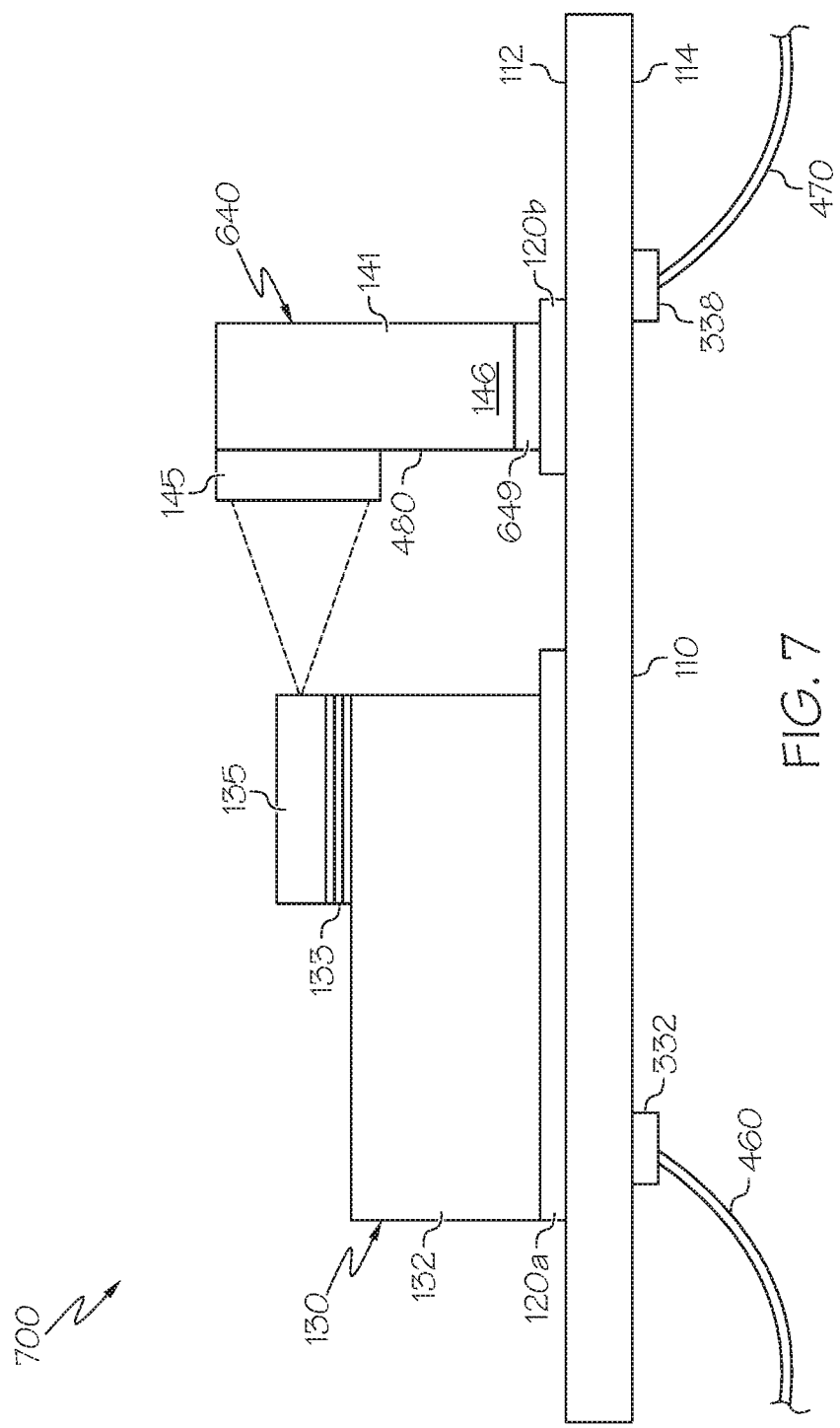
FIG. 7 schematically depicts a side view of an example optical power transfer device where the first subassembly containing the laser and the second subassembly containing the phototransducer are mounted on separate metallization layers and the laser is configured to horizontally illuminate the phototransducer, according to one or more embodiments described and illustrated herein.

FIG. 6 shows an example optical power transfer device 600 similar to the optical power transfer device 400 of FIG. 4 except the phototransducer 145 is coupled directly to the second mount 141 without the substrate 143, while the spacer block 649 is coupled between the second mount 141 and the metallization layer 120. The second mount 141 may be configured as shown in FIG. 1 and described above. The electric current generated in the phototransducer 145 in response to the laser beam from the laser 135 flows laterally (in the +/−Y direction) from the first conductive block 142 and/or the third conductive block 146 towards the grounded second conductive block 144 through the wirebonds 147. The spacer block 649 is made of an electrically insulating material and prevents the flow of any current into the metallization layer 120 and the cooling chip 110. As a result, any loss of electrical energy generated by the optical power transfer device 600 and a possible short circuit is prevented. FIG. 7 shows an example optical power transfer device 700 similar to the optical power transfer device 600 of FIG. 6 except that the first subassembly 130 is mounted on a metallization layer 120*a*, different from the metallization layer 120*b* on which the second subassembly 140 is mounted. The cooling chip 110 can be specifically patterned to provide the separate layers 120*a* and 120*b* as mounting pads for the first subassembly 130 and the second subassembly 140 respectively such that they are electrically isolated.

FIG. 8 shows an example optical power transfer device 800 similar to the optical power transfer device 700 of FIG. 7 except that the first subassembly 830 includes a spacer block 839 coupled between the first mount 132 and the metallization layer 120*a* and the laser 135 is coupled directly to the first mount 132 without the substrate 133. The spacer block 839 is made of an electrically insulating and thermally conductive material, thus allowing the heat generated by the laser 135 to be conducted to the cooling chip 110 without allowing any current to flow into the metallization layer 120*a* and the cooling chip 110. As a result, there is no loss of electrical energy and the laser is operable at a high efficiency. FIG. 9 shows an example optical power transfer device 900 similar to the optical power transfer device 800 of FIG. 8 except that the first subassembly 930 does not include the spacer block 839 coupled between the first mount 132 and the metallization layer 120*a*. Additionally the second subassembly 940 does not include the spacer block 649 coupled between the second mount 141 and the metallization layer 120*b*. As a result, in addition to the heat flow from the laser 135 to the cooling chip 110, there may be electrical current flow through the first mount 132 into the metallization layer 120*a* as well as through the second mount 141 into the metallization layer 120*b*. Advantageously, the current flow from the metallization layers 120*a* and 120*b* into the cooling chip 110 can be, however, prevented by making the cooling chip 110 (in FIG. 9) from an electrically insulating material such as, but not limited to, undoped silicon.

FIG. 10 schematically depicts a side view of an example optical power transfer device 1000 with the cooling chip 110, where the phototransducer 145 is positioned above the laser 135 such that the laser 135 can vertically illuminate the phototransducer 145. The first subassembly 1030 has the substrate 133 coupled to the metallization layer 120 and the laser 135 is bonded to the substrate 133 in an edge-emitting configuration. The second subassembly 1040 has a second mount 1041. As shown in FIG. 10, the example second mount 1041 may be an L-mount extending above the laser 135. The second mount 1041 has two portions—a vertical portion 1041*a* and a horizontal portion 1041*b*, which extends from the top of the vertical portion 1041*a* towards the first subassembly 130. The spacer block 649 is coupled between the second mount 141 and the metallization layer 120. The phototransducer 145 is bonded to a substrate 143, which is mounted on the bottom surface 1042 of the horizontal portion 1041*b* of the second mount 1041. In some embodiments, the substrates 133 and 143 may be DBC substrates having suitably high thermal conductivity. In other embodiments, the substrate 133 may be replaced with any other substrate configured to electrically isolate the laser 135 from the metallization layer 120 and the substrate 143 may be replaced with any other substrate configured to electrically isolate the phototransducer 145 from the second mount 141. Vertical illumination is achieved by incorporating an optical element 1050 configured to redirect the laser beam from the laser 135 towards the phototransducer 145. The optical element 1050 may be a prism, a mirror, a lens, a reflector, a plate, and a beam splitter or the like. In the embodiment shown in FIG. 10, the optical element 1050 is a prism and has a surface 1052 for redirecting the laser beam up towards the phototransducer 145 by total internal reflection. As in FIG. 4, the cooling chip 110 has the fluid inlet 332 and the fluid outlet 338 through the bottom surface 114. The fluid inlet 332 is fluidly coupled to the fluid injection conduit 460 and the fluid outlet 338 is fluidly coupled to a fluid extraction conduit 470.

Figure 11:
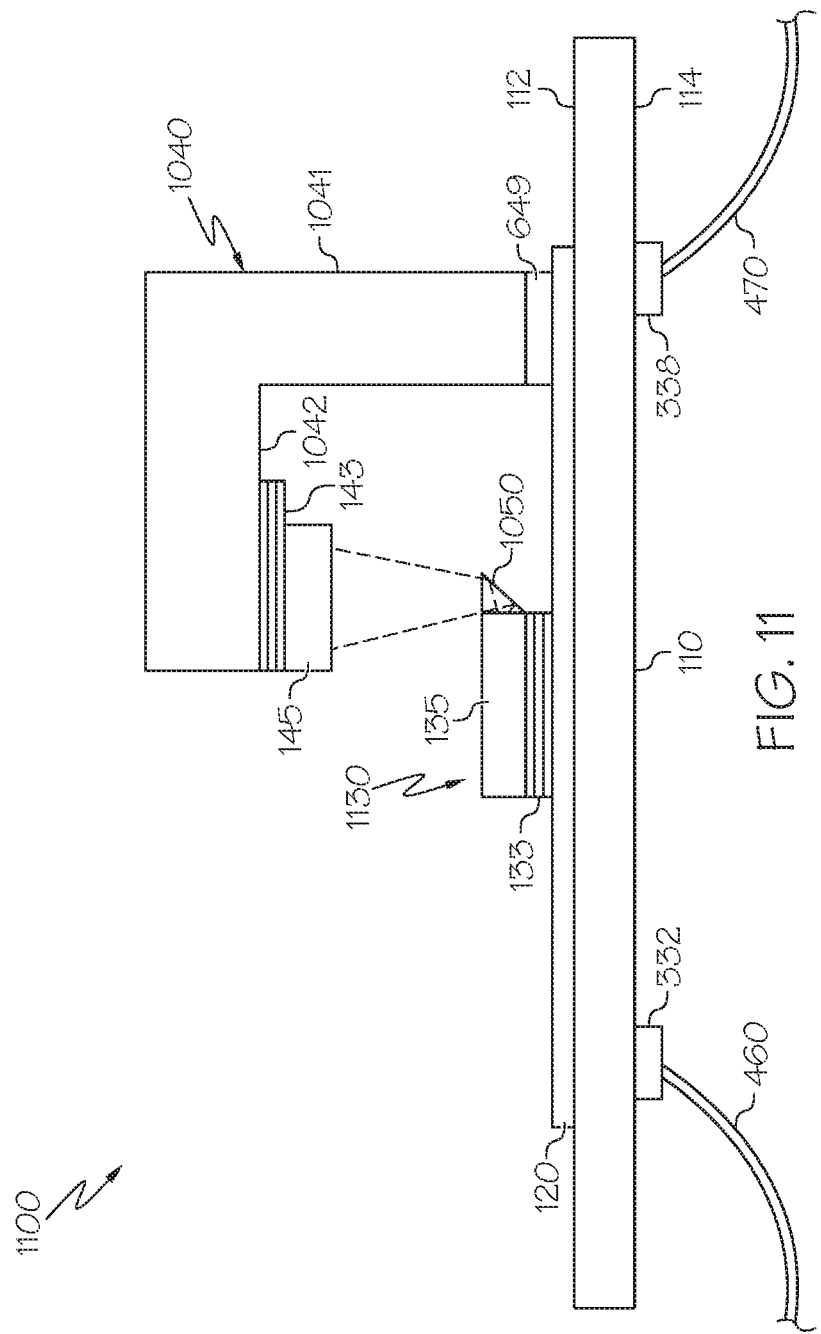
FIG. 11 schematically depicts a side view of an example optical power transfer device where the laser is configured to vertically illuminate the phototransducer by refracting the laser beam through an optical element coupled to the laser, according to one or more embodiments described and illustrated herein.
Figure 12:
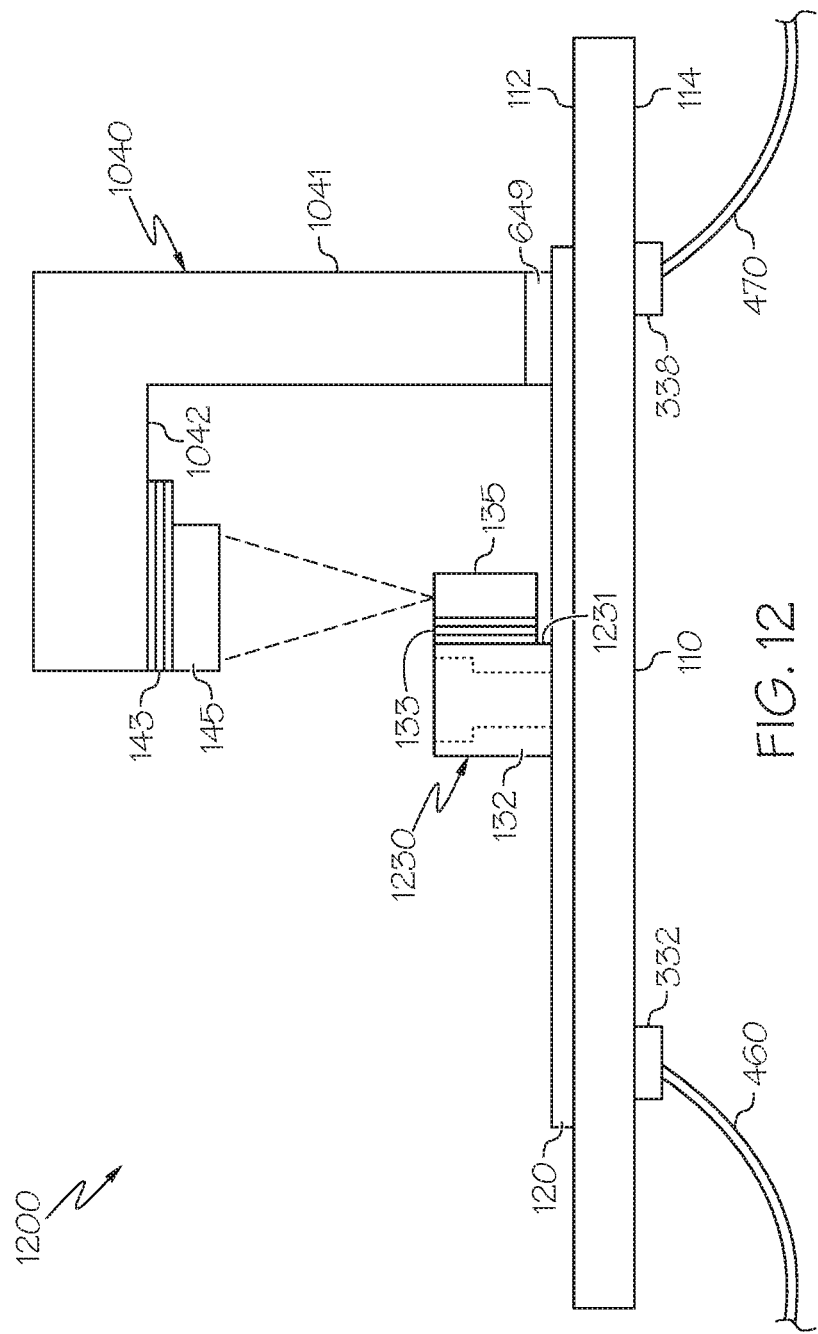
FIG. 12 schematically depicts a side view of an example optical power transfer device where the laser is mounted to the side of a C-mount such that the laser beam is directly incident on the phototransducer to vertically illuminate the phototransducer, according to one or more embodiments described and illustrated herein.

FIG. 11 shows an example optical power transfer device 1100 similar to the optical power transfer device 1000 of FIG. 10 except the optical element 1050 is coupled to the emitting face of the laser 135 and refracts the laser beam up towards the phototransducer 145. FIG. 12 shows an example optical power transfer device 1200 similar to the optical power transfer device 1000 of FIG. 10 except that the first subassembly 1230 has a first mount 132 configured to position the laser 135 such that laser beam is directly incident on the phototransducer 145, without the need for an optical element 1050. In the embodiment shown in FIG. 12, the first mount 132 is a C-mount coupled to the metallization layer 120. The C-mount is a commercial mount intended for high-power applications and coupling may be achieved through direct soldering to the metallization layer 120. The laser 135 is bonded to the DBC substrate 133, which is mounted on a side 1231 of the first mount 132.

Figure 13:
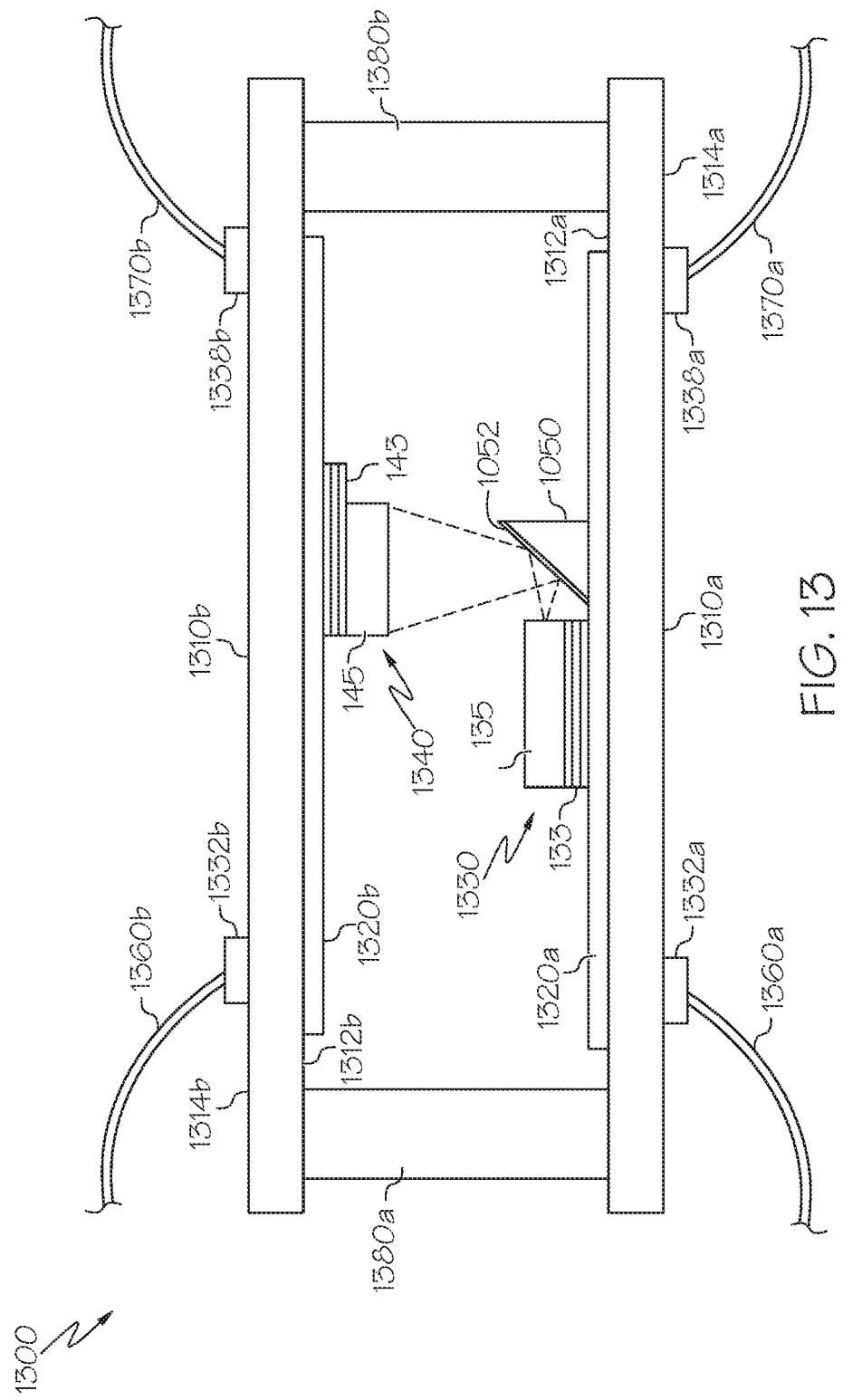
FIG. 13 schematically depicts a side view of an example optical power transfer device having two cooling chips positioned opposite to each other, where the laser mounted on the first cooling chip is configured to vertically illuminate the phototransducer mounted on the second cooling chip by reflecting the laser beam on an optical element, according to one or more embodiments described and illustrated herein.

FIGS. 13-15 shows schematics of a side view of example optical power transfer devices 1300, 1400, and 1500 respectively, having a first cooling chip 1310*a* and a second cooling chip 1310*b* positioned opposite to the first cooling chip 1310*a*. The cooling chips 1310*a*, 1310*b* are made of a semiconductor material such as silicon. The cooling chips 1310*a*, 1310*b* may be operated at the same or different inlet temperatures of the cooling fluid. Each of the cooling chips 1310*a*, 1310*b* has a top surface 1312*a*, 1312*b* and a bottom surface 1314*a*, 1314*b*. Each of the cooling chips 1310*a*, 1310*b* has a metallization layer 1320*a*, 1320*b*, on a portion of the first surface 1312*a*, 1312*b*. A fluid inlet 1332*a*, 1332*b* and a fluid outlet 1338*a*, 1338*b* are connected through the bottom surface 1314*a*, 1314*b* of each cooling chip 1310*a*, 1310*b*. One or more micro-channels 1324 extend between the fluid inlets 1332*a*, 1332*b* and the corresponding fluid outlets 1338*a*, 1338*b* and have a cooling fluid flowing through them (not shown in FIGS. 13-15). In some embodiments, the cooling fluid is a dielectric coolant such as, but not limited to, HFE-7100 (methoxy-nonafluorobutane). The fluid inlets 1332*a*, 1332*b* are fluidly coupled to fluid injection conduits 1460*a*, 1460*b*. The fluid outlets 1338*a*, 1338*b* are fluidly coupled to fluid extraction conduits 1470*a*, 1470*b*.

The first subassembly 1330 is mounted on the metallization layer 120*a* on the first cooling chip 1310*a*. The second subassembly 1340 is mounted on the metallization layer 120*b* on the second cooling chip 1310*b*. The first subassembly 1330 has the substrate 133 coupled to the metallization layer 120*a*. The laser 135 is bonded to the substrate 133 in an edge-emitting configuration. The second subassembly 1340 has the substrate 143 coupled to the metallization layer 120*b*. The phototransducer 145 is bonded to the substrate 143. In some embodiments, the substrates 133 and 143 may be DBC substrates having suitably high thermal conductivity. In other embodiments, the substrate 133 may be replaced with any other substrate configured to electrically isolate the laser 135 from the metallization layer 1320*a*, and the substrate 143 may be replaced with any other substrate configured to electrically isolate the phototransducer 145 from the metallization layer 1320b.

Optionally, spacers 1380a, 1380b are used to electrically isolate the first cooling chip 1310a from the second cooling chip 1310b. The spacers 1380a, 1380b may be either thermally conducting or thermally insulating. In some embodiments, where the cooling chips 1310a, 1310b are made of doped silicon and the metallization layers 1320a, 1320b conduct current into the cooling chips 1310a, 1310b, the spacers 1380a, 1380b are made of an electrically insulating material.

Referring to FIG. 13 which shows the example optical power transfer device 1300, vertical illumination is achieved by incorporating an optical element 1050 configured to redirect the laser beam from the laser 135 by total internal reflection towards the phototransducer 145. The optical element 1050 may be a prism, a mirror, a lens, a reflector, a plate, and a beam splitter or the like. In the embodiment shown in FIG. 13, the optical element 1050 is a prism and has a surface 1052 for reflecting the laser beam up towards the phototransducer 145. FIG. 14 shows the example optical power transfer device 1400 similar to the optical power transfer device 1300 of FIG. 13 except the optical element 1050 is coupled to the laser 135 and refracts the laser beam up towards the phototransducer 145. FIG. 15 shows the example optical power transfer device 1500 similar to the optical power transfer device 1300 of FIG. 13 except that the first subassembly 1530 has a first mount 132 configured to position the laser 135 such that laser beam is directly incident on the phototransducer 145, without the need for an optical element 1000. In the embodiment shown in FIG. 15, the first mount 132 is a C-mount coupled to the metallization layer 120a. The laser 135 is bonded to the substrate 133, which is mounted on the side 1531 of the first mount 132.

Advantageously, the optical power transfer device converts optical energy into electrical energy at a high efficiency and reliability. As described above, the optical power transfer device includes a laser and phototransducer. As a non-limiting example, the laser inputs DC voltage of about 1-3 V and converts it into optical power by outputting a monochromatic beam having wavelength of around 980 nm. Wavelengths in the range of 800-1000 nm have been demonstrated and this range could be further expanded (for example, 200-2000 nm) in the future. Generating a beam of wavelength around 980 nm offers access to lower-cost high-power laser sources for the benefit of the device, while other wavelengths may provide other benefits. The phototransducer receives the laser beam and converts the optical energy into electrical power, and outputs DC voltage of up to around 24 V, and higher in future devices.

The optical power transfer device can be quickly and efficiently cooled for optical power transfer applications that require high levels of heat dissipation. The device is constructed by mounting the first subassembly containing the laser on the metallization layer of the cooling chip. The second subassembly containing the phototransducer is then mounted such that the phototransducer is exposed to the laser beam generated by the laser. During the operation of the device, the laser generates a substantial amount of heat. This heat is carried to the cooling chip by one or more spacer blocks and/or substrates of the first subassembly. A cooling fluid is pumped through the fluid inlet of the cooling chip. The cooling fluid absorbs the generated heat as it flows through one or more micro-channels between the fluid inlet and the fluid outlet. The cooling fluid is subsequently pumped out from the fluid outlet of the cooling chip. In some embodiments, the cooling fluid is flowed through a heat exchanger (not shown) remotely located from the cooling chip to dispose the heat therein. The cooling fluid is then rerouted back to the fluid inlet. In some embodiments, the rate of flow of cooling fluid through the micro-channels is adjusted using a micropump (not shown) fluidly coupled to the cooling chip, in response to the amount of heat generated.

The optical power transfer device with an embedded active cooling chip offers significant benefits. The embedded active cooling chip has advantages over other remote cooling techniques because it reduces the number of intermediate packaging layers, corresponding thermal resistances of the packaging layers as well as the overall package size of the optical power transfer device. Further, the cooling chip minimizes the effects of excess heat generated during operation of the device and ensures optimal thermal performance of the device.

The packaging of the first subassembly containing the laser and the second subassembly containing the phototransducer is designed such that the phototransducer is adequately aligned to receive the maximum exposure to the laser beam generated by the laser. This design ensures a highly efficient performance by the optical power transfer device in converting optical power to electrical power.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that the various embodiments disclosed herein demonstrate an optical power transfer device with an embedded active cooling chip. It should also be understood that these embodiments are merely exemplary and are not intended to limit the scope of this disclosure.

What is claimed is:

1. An optical power transfer device comprising:
    a cooling chip made of a semiconductor material and comprising:
        at least one metallization layer on a portion of a first surface of the cooling chip;
        at least one inlet through a second surface of the cooling chip, wherein the second surface is opposite to the first surface;
        at least one outlet through the second surface;
        an upper layer comprising one or more micro-channels defined by an array of fins and extending between and fluidly coupled to the at least one inlet and the at least one outlet, the one or more micro-channels having a cooling fluid flowing therethrough; and
        a lower layer comprising the at least one inlet and the at least one outlet;
    a first subassembly mounted on the at least one metallization layer on the cooling chip, the first subassembly comprising a laser; and
    a second subassembly mounted on the cooling chip, the second subassembly comprising a phototransducer configured to receive a laser beam from the laser and a first mount coupled to the phototransducer, wherein the first mount comprises:
        a first conductive block electrically connected to the phototransducer;

a second conductive block electrically connected to electrical ground and configured to mount the phototransducer;

a third conductive block electrically connected to the phototransducer;

a first insulating block between the first conductive block and the second conductive block; and a second insulating block between the second conductive block and the third conductive block.

2. The optical power transfer device of claim 1, wherein the first subassembly further comprises a substrate coupled to the laser, the substrate configured to electrically isolate the laser from the at least metallization layer.

3. The optical power transfer device of claim 1, wherein the first subassembly further comprises a second mount coupled between the at least one metallization layer and the laser, the second mount made of an electrically conductive material.

4. The optical power transfer device of claim 3, wherein the first subassembly further comprises a first spacer block coupled between the second mount and the at least one metallization layer, the first spacer block made of an electrically insulating material.

5. The optical power transfer device of claim 1, wherein the second subassembly further comprises a substrate coupled to the phototransducer, the substrate configured to electrically isolate the phototransducer from the at least metallization layer.

6. The optical power transfer device of claim 1, wherein the second subassembly further comprises a second spacer block coupled to the first mount and positioned between the first mount and the phototransducer, the second spacer block made of an electrically insulating material.

7. The optical power transfer device of claim 1, wherein the second subassembly further comprises a second spacer block coupled to the first mount and positioned between the first mount and the at least one metallization layer, the second spacer block made of an electrically insulating material.

8. The optical power transfer device of claim 1, wherein the first conductive block, the second conductive block and the third conductive block are made of copper.

9. The optical power transfer device of claim 1, wherein the first insulating block and the second insulating block are made of glass-reinforced epoxy laminate material.

10. The optical power transfer device of claim 1, wherein one or more optical elements are used to redirect the laser beam from the laser to the phototransducer, the optical element comprising one or more of: a prism, a mirror, a lens, a reflector, a plate, and a beam splitter.

11. The optical power transfer device of claim 1, wherein the second subassembly is mounted on the same metallization layer as the first subassembly.

12. The optical power transfer device of claim 1, wherein the second subassembly is mounted on a different metallization layer than the first subassembly.

* * * * *

UNITED STATES PATENT AND TRADEMARK OFFICE
CERTIFICATE OF CORRECTION

PATENT NO. : 10,901,161 B2
APPLICATION NO. : 16/131842
DATED : January 26, 2021
INVENTOR(S) : Ercan M. Dede et al.

It is certified that error appears in the above-identified patent and that said Letters Patent is hereby corrected as shown below:

On the Title Page

In page 2, Column 2, item (56), U.S. patent documents, Cite no. 22:
Delete "Deisseroth" and insert --Deisseroth et al.--, therefor.

Signed and Sealed this
Sixth Day of April, 2021

Drew Hirshfeld
*Performing the Functions and Duties of the
Under Secretary of Commerce for Intellectual Property and
Director of the United States Patent and Trademark Office*